(12) United States Patent
Liu et al.

(10) Patent No.: US 12,103,294 B2
(45) Date of Patent: Oct. 1, 2024

(54) GRAPHENE BASED HEAT SINK AND METHOD FOR MANUFACTURING THE HEAT SINK

(71) Applicant: SHT Smart High-Tech AB, Gothenburg (SE)

(72) Inventors: Johan Liu, Västra Frölunda (SE); Nan Wang, Mölndal (SE)

(73) Assignee: SHT Smart High-Tech AB, Gothenburg (SE)

(*) Notice: Subject to any disclaimer, the term of this patent is extended or adjusted under 35 U.S.C. 154(b) by 344 days.

(21) Appl. No.: 17/524,871

(22) Filed: Nov. 12, 2021

(65) Prior Publication Data
US 2022/0072825 A1 Mar. 10, 2022

Related U.S. Application Data

(63) Continuation of application No. 17/106,754, filed on Nov. 30, 2020, now Pat. No. 11,235,557, which is a
(Continued)

(51) Int. Cl.
*B32B 9/00* (2006.01)
*B32B 5/16* (2006.01)
(Continued)

(52) U.S. Cl.
CPC ............ *B32B 9/007* (2013.01); *B32B 5/16* (2013.01); *B32B 7/027* (2019.01); *B32B 7/12* (2013.01);
(Continued)

(58) Field of Classification Search
CPC .......... B32B 9/007; B32B 7/027; B32B 5/16; B32B 7/12; B32B 9/04; B32B 37/24;
(Continued)

(56) References Cited

U.S. PATENT DOCUMENTS 4,331,495 A * 5/1982 Lackman .............. B29C 70/865
112/440
5,180,459 A * 1/1993 Bauer .................... B32B 9/047
264/296
(Continued)

FOREIGN PATENT DOCUMENTS

CN 101048055 A 10/2007
CN 105722375 A 3/2018
(Continued)

OTHER PUBLICATIONS

English translation of Second Chinese Office Action and Search Report dated Jun. 20, 2023 for CN Application No. 201880094256.X, 14 pages.
(Continued)

*Primary Examiner* — Raheena R Malik
(74) *Attorney, Agent, or Firm* — RMCK Law Group, PLC

(57) ABSTRACT

Heat sink and method of manufacturing a graphene based heat sink, the method comprising: providing a first and second graphene film; arranging a layer of nanoparticles on a surface of the first and second graphene film to improve an adhesion strength between the graphene films; attaching the second graphene film to the first graphene film by means of an adhesive and the layer of nanoparticles; forming a laminated graphene film comprising a number of graphene film layers by repeating the steps, wherein the laminated graphene film is formed to have an anisotropic thermal conductivity; assembling a plurality of laminated graphene films by applying pressure and heat to cure the adhesive to form a graphene block; and removing selected portions of the graphene block to form a heat sink comprising fins extending from a base plate of the heat sink.

10 Claims, 5 Drawing Sheets

Related U.S. Application Data continuation of application No. PCT/SE2019/050080, filed on Jan. 31, 2019, and a continuation-in-part of application No. PCT/SE2018/050593, filed on Jun. 7, 2018.

(51) Int. Cl.

| | | |
|---|---|---|
| *B32B 7/027* | (2019.01) | |
| *B32B 7/12* | (2006.01) | |
| *B32B 9/04* | (2006.01) | |
| *C01B 32/194* | (2017.01) | |
| *F28F 3/02* | (2006.01) | |
| *F28F 21/02* | (2006.01) | |
| *H05K 7/20* | (2006.01) | |
| *B32B 37/12* | (2006.01) | |
| *B32B 37/24* | (2006.01) | |
| *B32B 38/00* | (2006.01) | |
| *B32B 38/10* | (2006.01) | |
| *B82Y 30/00* | (2011.01) | |
| *B82Y 40/00* | (2011.01) | |

(52) U.S. Cl.
CPC .............. *B32B 9/04* (2013.01); *C01B 32/194* (2017.08); *F28F 3/02* (2013.01); *F28F 21/02* (2013.01); *H05K 7/2039* (2013.01); *B32B 2037/1253* (2013.01); *B32B 37/24* (2013.01); *B32B 38/004* (2013.01); *B32B 38/10* (2013.01); *B32B 2255/205* (2013.01); *B32B 2255/26* (2013.01); *B32B 2264/108* (2013.01); *B32B 2307/302* (2013.01); *B32B 2313/04* (2013.01); *B32B 2319/00* (2013.01); *B32B 2333/00* (2013.01); *B32B 2363/00* (2013.01); *B32B 2375/00* (2013.01); *B32B 2379/08* (2013.01); *B32B 2457/00* (2013.01); *B82Y 30/00* (2013.01); *B82Y 40/00* (2013.01); *Y10T 156/1062* (2015.01); *Y10T 156/108* (2015.01)

(58) Field of Classification Search
CPC .................. B32B 38/004; B32B 38/10; B32B 2037/1253; B32B 2255/205; B32B 2255/26; B32B 2264/108; B32B 2307/302; B32B 2313/04; B32B 2319/00; B32B 2333/00; B32B 2363/00; B32B 2375/00; B32B 2379/08; B32B 2457/00; F28F 3/02; F28F 21/02; H05K 7/2039; C01B 32/194; Y10T 156/1062; Y10T 156/108; B82Y 30/00; B82Y 40/00
See application file for complete search history.

(56) References Cited

U.S. PATENT DOCUMENTS

| | | | |
|---|---|---|---|
| 7,531,595 B2 | 5/2009 | Lewandowski et al. | |
| 7,797,808 B2* | 9/2010 | Zhang | B32B 27/08 29/458 |
| 9,338,927 B2 | 5/2016 | Mataya et al. | |
| 9,645,454 B2 | 5/2017 | Naito et al. | |
| 9,746,259 B2 | 8/2017 | Tanaka et al. | |
| 10,087,073 B2* | 10/2018 | Lin | H01L 23/373 |
| 11,235,557 B2* | 2/2022 | Liu | B32B 9/04 |
| 2004/0188081 A1* | 9/2004 | Oh | F28F 13/00 165/185 |
| 2005/0111189 A1* | 5/2005 | Smalc | H01L 23/552 257/722 |
| 2006/0134362 A1 | 6/2006 | Lu et al. | |
| 2007/0053168 A1 | 3/2007 | Sayir et al. | |
| 2007/0213449 A1 | 9/2007 | Lewandowski et al. | |
| 2008/0019097 A1* | 1/2008 | Zhang | F28F 13/00 361/704 |
| 2011/0114342 A1* | 5/2011 | Ono | B32B 5/18 169/48 |
| 2011/0303399 A1* | 12/2011 | Sakimichi | H01L 23/36 165/185 |
| 2012/0070612 A1* | 3/2012 | Lee | B82Y 30/00 428/688 |
| 2012/0156424 A1 | 6/2012 | Chen et al. | |
| 2012/0295416 A1* | 11/2012 | Kimura | C09J 7/10 523/412 |
| 2013/0295384 A1 | 11/2013 | Ma et al. | |
| 2014/0190676 A1 | 7/2014 | Zhamu et al. | |
| 2014/0219906 A1 | 8/2014 | Kim et al. | |
| 2015/0096731 A1* | 4/2015 | Koch | F28F 21/02 264/339 |
| 2016/0381832 A1 | 12/2016 | Hurbi et al. | |
| 2018/0023904 A1* | 1/2018 | Kato | B32B 27/38 165/80.2 |
| 2021/0078288 A1 | 3/2021 | Liu et al. | |
| 2021/0148648 A1* | 5/2021 | Liu | B32B 7/027 |
| 2021/0362471 A1* | 11/2021 | Zhamu | B32B 9/04 |
| 2022/0072825 A1* | 3/2022 | Liu | H01L 23/373 |

FOREIGN PATENT DOCUMENTS

| | | |
|---|---|---|
| CN | 106113731 A | 3/2019 |
| CN | 107209387 A | 5/2020 |
| EP | 3258489 A1 | 12/2017 |
| JP | 2009526113 A | 7/2009 |
| JP | 2009529089 A | 8/2009 |
| JP | 2009295921 A | 12/2009 |
| JP | 2010114421 A | 5/2010 |
| JP | 2012136022 A | 7/2012 |
| JP | 2014022450 A | 2/2014 |
| JP | 2014200926 A | 10/2014 |
| KR | 20170095316 A | 8/2017 |
| KR | 20170121543 A | 11/2017 |
| WO | 2007090813 A1 | 8/2007 |
| WO | 2016185688 A1 | 11/2016 |
| WO | 2017013497 A2 | 1/2017 |
| WO | 2018160106 A1 | 9/2018 |
| WO | 2019194708 A1 | 10/2019 |

OTHER PUBLICATIONS

English Translation of Notice of Preliminary Rejection mailed Apr. 6, 2023 from the Korean Intellectual Property Office for Korean Application No. 10-2022-7030532, 14 pages.
Extended European Search Report dated Dec. 8, 2021 for European Patent Application No. 18921365.5, 6 pages.
PCT International Search Report and Written Opinion for International Application No. PCT/SE2018/050593 mailed Feb. 18, 2019, 9 pages.
PCT International Search Report and Written Opinion for International Application No. PCT/SE2019/050080 mailed Apr. 10, 2019, 9 pages.
English Translation of Chinese Office Action and Search Report dated Dec. 5, 2022 for Chinese Application No. 201980037278.7, 12 pages.
Partial English Translation of Chinese Office Action dated Dec. 9, 2023 for Chinese Application No. 201980037278.7, 14 pages.
Wei, Z. et al., "In-plane lattice thermal conductivities of multilayer graphene films," Carbon, vol. 49, 2011, pp. 2653-2658.

\* cited by examiner

GRAPHENE BASED HEAT SINK AND METHOD FOR MANUFACTURING THE HEAT SINK

CROSS-REFERENCE TO RELATED APPLICATIONS

This application is a continuation of U.S. patent application Ser. No. 17/106,754, filed Nov. 30, 2020, which is: (i) a bypass continuation of International Application No. PCT/SE2019/050080, filed Jan. 31, 2019, which claims priority to International Patent Application No. PCT/SE2018/050593 filed Jun. 7, 2018, and (ii) a bypass continuation-in-part of International Application No. PCT/SE2018/050593, filed Jun. 7, 2018. The disclosures of each of the above applications are incorporated herein by reference in their entirety.

FIELD OF THE INVENTION

The present invention relates to a heat sink made from a laminated graphene based thermally conductive film and to a method for manufacturing such a heat sink. In particular, the present invention relates to a heat sink made from a plurality of layers of graphene film.

BACKGROUND OF THE INVENTION

With the continuous development of modern electronics devices and systems, their increasing power densities have caused higher operating temperature. Therefore, effective thermal management is becoming extremely crucial to remove the large amount of heat required for ensuring high performance and long lifetime reliability. Thermal conductivity of traditional thermal interface materials (TIMs), a very important element for heat dissipation, is often less than max 10 W/mK, usually around 4 or 5 W/mK in vertical directions. Great efforts have hence been made to develop high performance TIMs based on carbon materials (e.g., graphite nano-platelets, carbon nanotubes and carbon fibers) in order to solve this problem.

A considerable number of studies have been devoted to increasing their thermal conductivity by increasing the graphene loading in graphene based thermally conductive adhesives. However, it is not practical for the fabrication process when the graphene content is too high.

Graphene, a surprising allotrope of carbon which is comprised of only one layer of atoms arranged in a two-dimensional hexagonal lattice, exhibits a number of unique properties, such as ultrafast electron mobility, super high mechanical strength, and unusually superior thermal performance (in-plane thermal conductivity=5000 W/mK). Besides, it is necessary to arrange graphene into particular structures so as to fulfill diverse functionalities, especially application in electronic devices.

For TIMs, high thermal conductivity in the vertical direction is needed. Therefore, it is essential to assemble graphene into a vertically aligned architecture to facilitate heat dissipation in the normal direction of contact solid interfaces. It is already reported to prepare vertically aligned graphite film by compacting aligned graphite sheets. However, it's difficult to fabricate this type of material in an automatic and cost-effective way. Moreover, due to high stiffness and weak interlayer bonding strength of graphite, the vertically assembled graphite composite shows high hardness and is brittle at the direction perpendicular to the assembled direction.

Therefore, improved methods to vertically align graphene are desired to increase the usability of thermal interface materials with high out-of-plane thermal conductivity.

SUMMARY

In view of above-mentioned and other drawbacks of the prior art, it is an object of the present invention to provide an improved method of manufacturing a thermally conductive film.

According to a first aspect of the invention, there is provided a method of manufacturing a graphene based heat sink, the method comprising: providing a first graphene film; providing a second graphene film; arranging a layer of nanoparticles on a surface of the first and second graphene film, wherein the nanoparticles are configured to improve an adhesion strength between the first and second graphene films; arranging an adhesive on the first graphene film; attaching the second graphene film to the first graphene film by means of the adhesive and the layer of nanoparticles; forming a laminated graphene film comprising a predetermined number of graphene film layers by repeating the steps of arranging a layer of nanoparticles, arranging an adhesive and attaching a graphene film, wherein the laminated graphene film is formed to have an anisotropic thermal conductivity; assembling a plurality of laminated graphene films by applying pressure and heat to cure the adhesive to form a graphene block; and removing selected portions of the graphene block to form a heat sink comprising fins extending from a base plate of the heat sink.

The graphene film can be considered to comprise a plurality of graphene layers arranged to form a graphene film. The graphene film may for example be formed from graphene flakes having an average lateral size in the range of 2-100 µm. It is thus not required that the graphene film is a continuous graphene layer. Instead, the graphene film may consist of a stack of graphene layers, and the graphene film may thus be seen as a graphene based film. The lateral size of the graphene flakes in such a graphene film determines the amount of grain boundaries in the material. Since the grain boundaries can greatly increase the phonon scattering and thereby decrease thermal conductivity, it is desirable to increase the lateral size of the graphene flakes to reduce the amount of grain boundaries, thereby improving in-plane thermal conductivity of the graphene film.

The present invention is based on the realization that a heat sink having advantageous and configurable properties can be manufactured according to the described method. In particular, the described heat sink utilizes the very high in-plane thermal conductivity of a graphene film guide the heat in a direction away from the base plate which in use is placed in contact with the object to be cooled.

The anisotropy in the described laminated graphene film comes from the fact that the in-plane thermal conductivity of graphene is significantly higher than the out of plane thermal conductivity. Since the laminated graphene film is formed from layers of graphene film, the high in-plane thermal conductivity of graphene can be maintained and utilized in the heat sink by means of the described manufacturing method.

According to one embodiment of the invention removing selected portions of the graphene block may comprise removing portions such that the thermal conductivity of a fin is higher in the plane of the fin than in a direction perpendicular to the plane of the fin. Thereby, the heat conduction in the heat sink can be controlled to be maximized in a direction away from the base plate.

According to one embodiment of the invention, removing selected portions of the graphene block may comprise removing portions such that the thermal conductivity of a fin is higher in a direction perpendicular to the plane of the fin and in a first direction of the plane of the fin compared to in a second direction of the plane of the fin. Thereby, the directionality of the heat conduction in the fin can be controlled which may be advantageous in applications where it is desirable to guide the heat in a specific direction in the plane of the fin.

According to one embodiment of the invention, removing selected portions of the graphene block comprises cutting or etching the graphene block. The required portions may for example be removed by cutting using a saw in which case trenches or gaps can be formed. It is also possible to use etching by providing a suitable etching mask. If etching is used, it may be possible to form fins having a more complex configuration compared to when using cutting.

According to one embodiment of the invention, the layer of nanoparticles may comprise needle shaped nanoparticles configured to anchor the first graphene film to the second graphene film. It has been found that the use of anchoring nanoparticles can serve to greatly enhance the adhesion between adjacent layers of graphene film. The nanoparticle may also have a spider-like shape where a number of needle structures protrude from a central portion.

According to one embodiment of the invention, the nanoparticles may advantageously be needle shaped nanoparticles formed from one of $Al_2O_3$, $SiO_2$, $Fe_2O_3$, $NiO_2$, $Cr_2O_3$, ZnO, Ag, Al, Cu, Ni, Cr, Ti, Mo, Fe, Mg and Li. It has been found that the aforementioned materials can be used to form suitable nanostructures to be used for anchoring.

According to one embodiment of the invention, the needle shaped nanoparticles may have a length in the range of 5 to 100 nm. A spider-like structure would thus have a diameter in the range of approximately 5 to 200 nm.

According to one embodiment of the invention, assembling the laminated graphene film comprises heating the film to a temperature in the range of 80° C. to 200° C. for a time period in the range of 10 to 300 minutes to cure the adhesive and to form the final film. The time and temperature required may be determined based on the choice of adhesive.

According to one embodiment of the invention, assembling the laminated graphene film comprises applying a pressure in the range of 0.1 to 3 MPa. The properties of the final film will depend on the parameters used for assembly.

According to one embodiment of the invention, the adhesive may be printed, dispensed or sprayed onto the graphene film. Printing may for example be performed using screen printing or stenciling. Moreover, all of the described methods can in principle be performed irrespective of the size of the surface on which the adhesive is deposited. Thereby, an easily scalable method is provided where an arbitrary size of the laminate structures can be handled.

According to one embodiment of the invention, the nanoparticles are printed, dispensed or sprayed onto the adhesive.

According to one embodiment of the invention, the graphene film may advantageously comprise a plurality of graphene layers having a turbostratic alignment between adjacent graphene layers. It has been found that a graphene or graphite film with turbostratic alignment between adjacent graphene layers exhibits a greatly improved in-plane thermal conductivity in comparison to known graphene-based and graphite heat spreading materials. The improved thermal conductivity can be explained by a reduced phonon scattering as a result of weaker interlayer binding for the turbostratic structure. In comparison, the strong interlayer binding between ordered graphene layers can lead to severe phonon interfacial scattering and reduce thermal conductivity of graphite films.

According to one embodiment of the invention, a ratio of adhesive in the in the laminated film is in the range of 10 wt % to 90 wt %. By controlling the ratio between adhesive and graphene film, the flexibility and tensile strength of the resulting heat sink can be controlled According to one embodiment of the invention, the adhesive may consist of at least one of, polyurethane, silicone rubber, polyimide, epoxy resin and polyacrylic resin. In particular, the adhesive used to bond the graphene films together may be a silicone rubber based polymer which has the property of high elasticity. The use of a silicone rubber based polymer can improve the flexibility and compression ratio of the assembled graphene film structure.

According to a second aspect of the invention there is provided a laminated graphene heat sink comprising: a base plate and a plurality of fins extending from the base plate, wherein the base plate and the fins comprise a plurality of layers of graphene film reaching from a bottom surface to a top surface of the heat sink, each layer of graphene film being separated from an adjacent layer of graphene film by an adhesive layer, and each layer of graphene film having an anisotropic thermal conductivity.

According to one embodiment of the invention, the base plate and fins of the heat sink are formed from a single solid graphene block comprising a plurality of layers of graphene film. Thereby, heat transfer from the base plate to the fins is uninterrupted.

Further effects and features of the second aspect of the invention are largely analogous to those described above in connection with the first aspect of the invention.

Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

These and other aspects of the present invention will now be described in more detail, with reference to the appended drawings showing an example embodiment of the invention, wherein.

DETAILED DESCRIPTION OF EXAMPLE EMBODIMENTS

Figure 1:
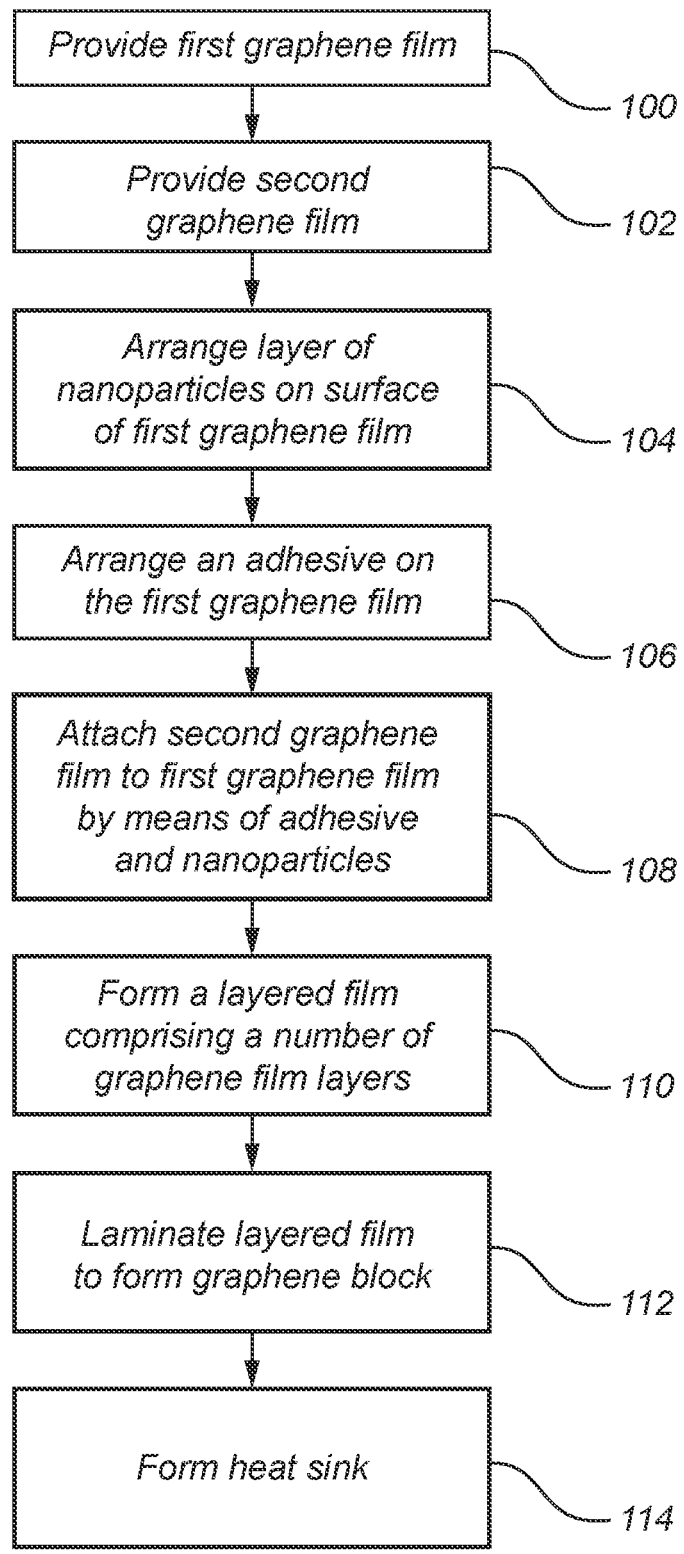
FIG. 1 is a flow chart outlining general steps of a method according to an embodiment of the invention.

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person. Like reference characters refer to like elements throughout. FIG. 1 is a flow chart outlining general steps of a method according to an embodiment of the invention, and the method will be described with further reference to FIG. 2 schematically illustrating steps of the method.

Figure 2A:
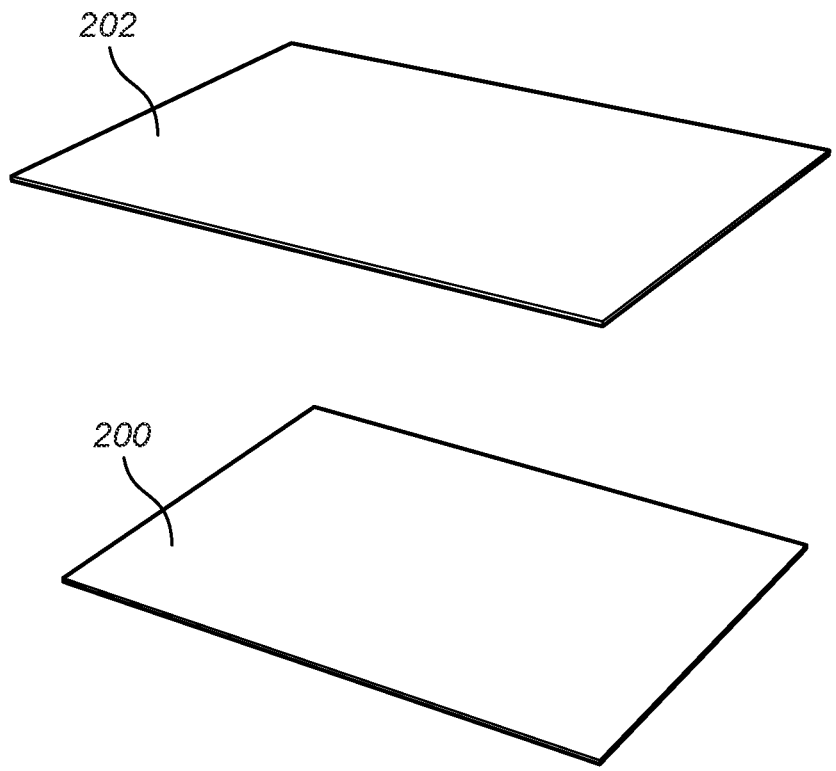
FIGS. 2A-2F schematically illustrate steps of a method according to an embodiment of the invention.

The method comprises providing 100 a first graphene film 200 and providing 102 a second graphene film 202 as illustrated in FIG. 2A. A graphene film suitable for use in the present context can be formed by providing graphene oxide sheets in an aqueous suspension; providing a substrate; providing the suspension on the substrate; heating the suspension on the substrate to form a graphene based film by means of self assembly; detaching the graphene based film from the substrate; performing thermal annealing of the graphene based film at a temperature in the range of 2800-3300° C. in an inert ambient; and pressing the graphene based film at a pressure in the range of 50-300 MPa. By means of the above described method a large-scale achievable method of producing a freestanding graphene film (GF) with an ultra-high in-plane thermal conductivity is provided. Further details of a graphene film having a high in-plane thermal conductivity and a method for manufacturing such a film can be found in PCT/SE2017/050185.

The graphene film 200, 202 may also comprise a plurality of graphene layers having a turbostratic alignment between adjacent graphene layers. It has been found that a graphite film with turbostratic alignment between adjacent graphene layers may exhibit an improved in-plane thermal conductivity in comparison to other known graphene-based and graphite heat spreading materials. Further details of a graphene film comprising a plurality of graphene layers having a turbostratic alignment between adjacent graphene layers can be found in PCT/SE2018/000009, hereby incorporated by reference.

Figure 2B:
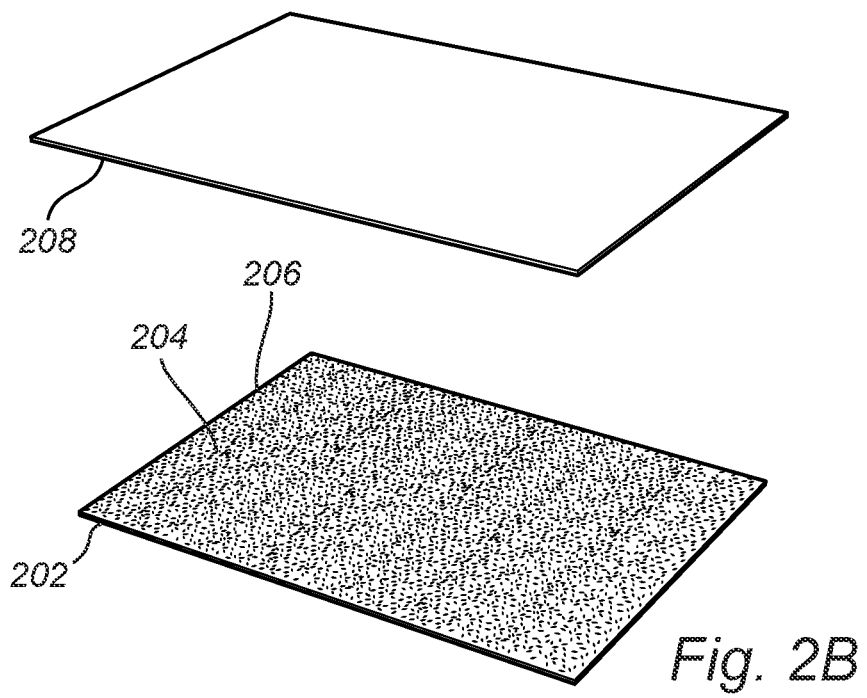
Figure 2C:
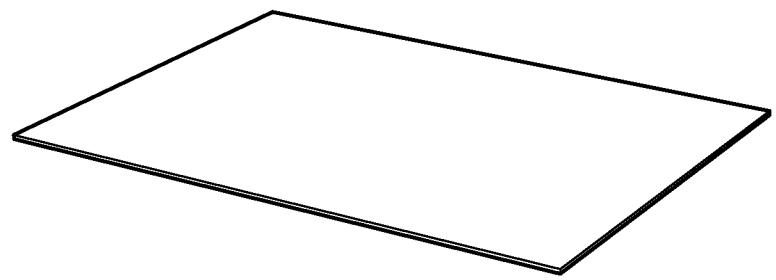
Figure 2C:
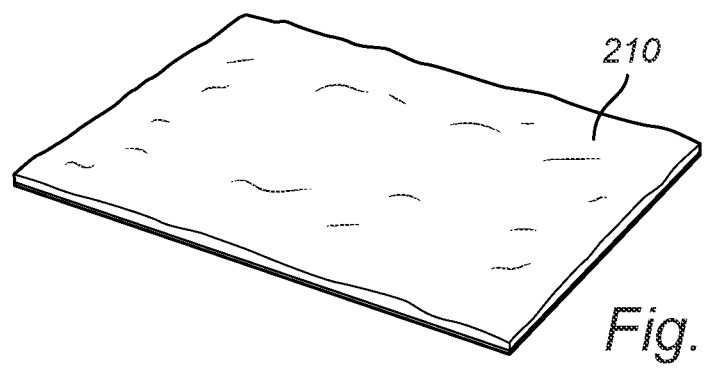

Next, illustrated in FIG. 2B, the method comprises arranging 104 a layer of nanoparticles 204 on a surface 206, 208 of the first and second graphene film 200, 202, wherein the nanoparticles 204 are configured to improve an adhesion strength between the first and second graphene films 200, 202. FIG. 2C illustrates the following step of arranging 106 an adhesive 210 on the first graphene film 200.

The layer of nanoparticles 204 advantageously comprises needle-shaped nanoparticles 204 configured to anchor the first graphene film 200 to the second graphene film 200 by improving the adhesion between the respective graphene film 200, 202 and the adhesive 210. The needle-shaped nanoparticles may consist of one elongated structure having a length in the range of 5 to 100 nm and an aspect ratio between length and width in the range of 5:1 to 50:1.

However, nanoparticles usable for anchoring may also comprise a plurality of more or less randomly connected needle-like nanostructures, e.g. forming a spider-like nanostructure. Moreover, the described type of nanoparticles can be formed from e.g. $Al_2O_3$, $SiO_2$, $Fe_2O_3$, $NiO_2$, $Cr_2O_3$, $ZnO$, Ag, Al, Cu, Ni, Cr, Ti, Mo, Fe, Mg and Li. Both the nanoparticles and the adhesive may be printed, dispensed or sprayed onto the graphene film.

Figure 2D:
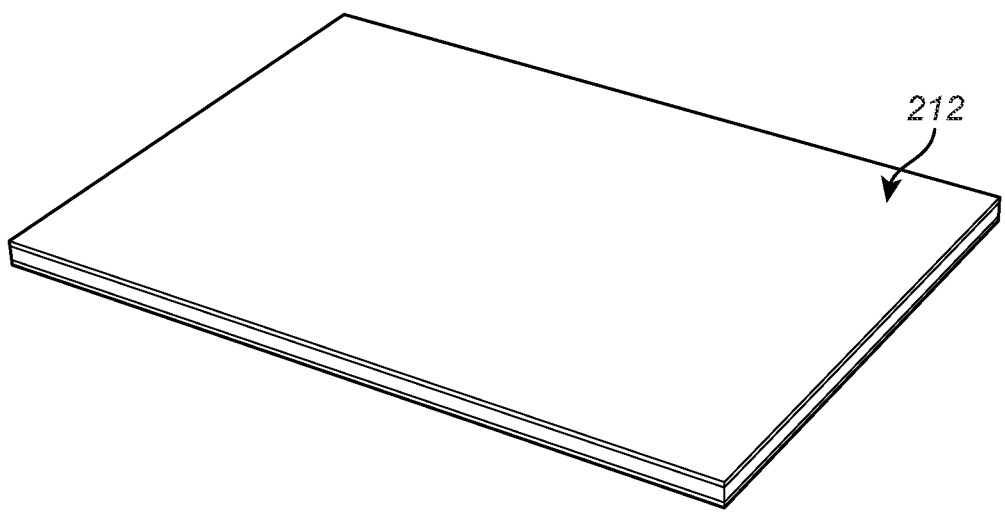

Once the nanoparticles 204 and the adhesive 210 is deposited on the graphene film, the second graphene film 202 is attached 108 to the first graphene film 200 by means of the adhesive 210 and the layer of nanoparticles 204 with the resulting laminated graphene film 212 illustrated in FIG. 2D. The nanoparticles 204 will become anchored to irregularities and uneven portions of the graphene film surface, and the adhesive 210 will in turn form a bond to both the graphene film surface and to the nanoparticles. Thereby, the adhesion between the first and second graphene films 200, 202 is significantly improved compared to if only an adhesive would be used.

According to an illustrative example, a graphene film with a thickness of 10 μm was coated by an adhesive in the form of polydimethylsiloxane belonging to the group of silicone rubbers. Tetrahydrofuran was used as a solvent to adjust the viscosity of polydimethylsiloxane. The concentration of the polydimethylsiloxane in tetrahydrofuran is in the range of 25-75 wt %. The deposition process was performed using a film coater. The coating thickness of polydimethylsiloxane is defined by the thread depth of the coating bar. After coating of the adhesive, the graphene film was heated to approximately 50-70° C. for 1-20 min to remove the tetrahydrofuran. The thickness of the adhesive layer may be selected based on the desired proportion between graphene film and adhesive in the final laminate structure.

Figure 2E:
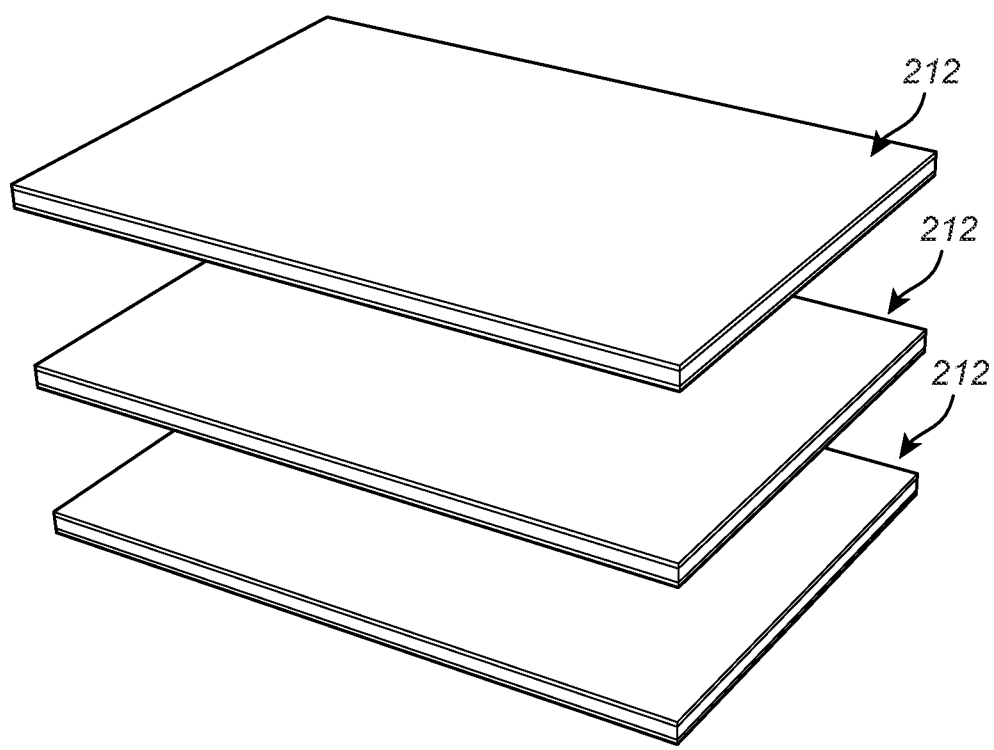

The above description outlines a method for attaching two graphene films 202, 204 to each other. Next, the method comprises forming 110 a laminated graphene film 212 comprising a predetermined number of graphene film layers by repeating the steps of arranging 104 a layer of nanoparticles, arranging 106 an adhesive and attaching 108 a graphene film. By combining a number of laminated graphene films 212 as illustrated in FIG. 2E, or by attaching one graphene layer at the time to a growing stack of graphene layers attached to each other by the described nanoparticles 204 and adhesive 210, a graphene block 214 of desirable thickness can be achieved.

Figure 2F:
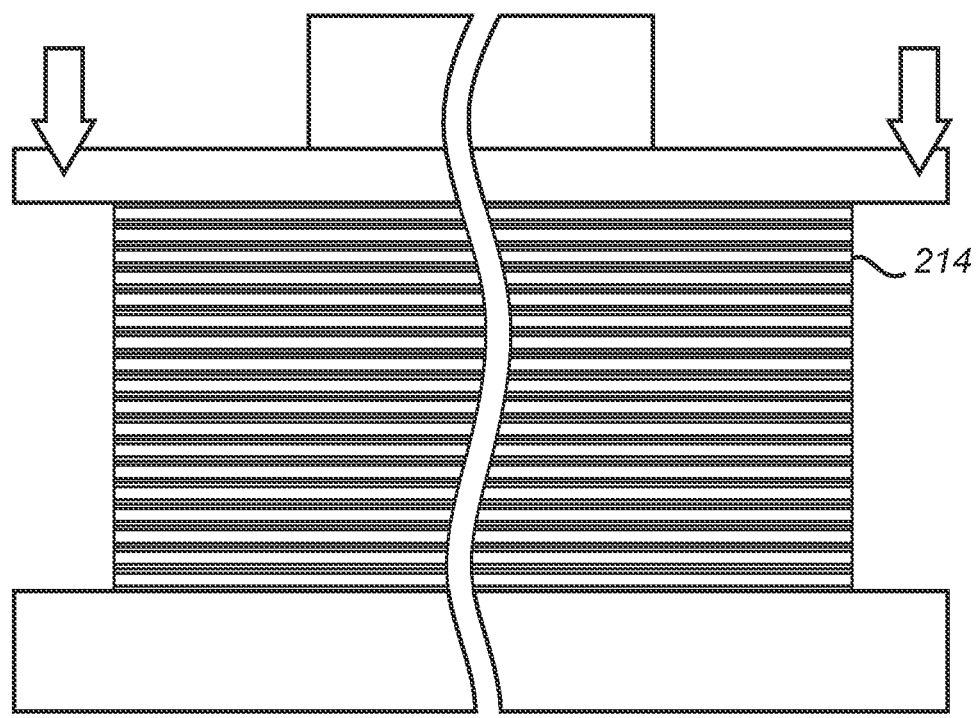

The graphene block 214 comprising the desired number of layers is laminated 112 by applying pressure using a pressure tool 215 as illustrated in FIG. 2F and by heating to cure the adhesive 210, thereby forming a graphene block 214. The pressure is in the range of 0.1 to 3 MPa. The assembled graphene block 214 is subsequently put into a furnace for curing. The curing temperature is in the range of 80-200° C. and the curing time is in the range of 10 to 300 minutes.

Cutting may for example be performed using a diamond saw, even though other cutting methods also are possible.

Figure 3:
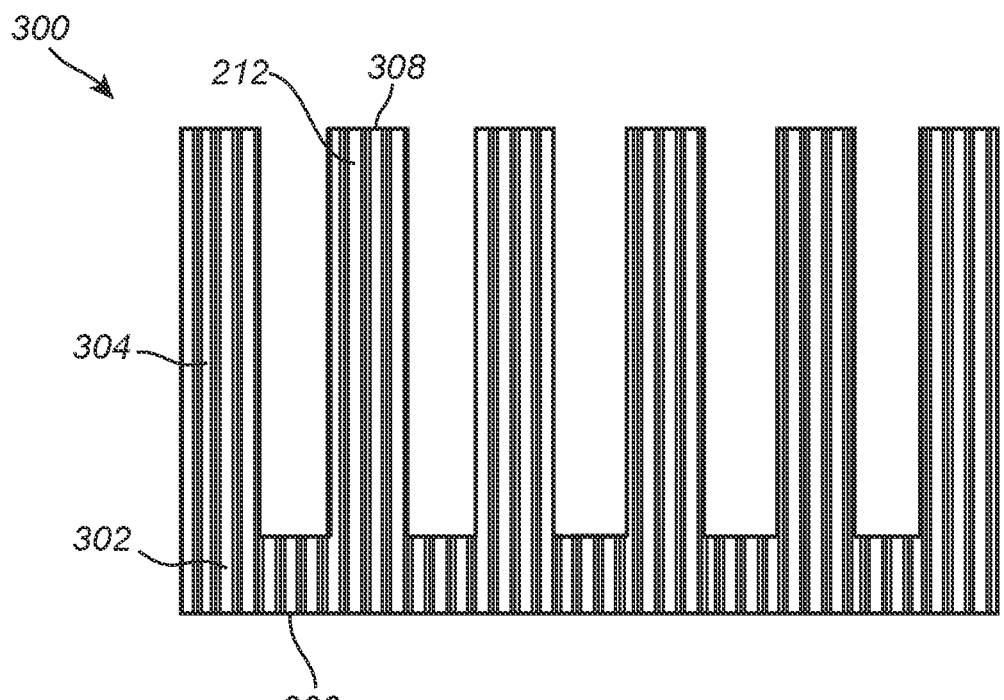
FIG. 3 schematically illustrates a detail of a method according to an embodiment of the invention.

FIG. 3 schematically illustrates a laminated graphene heat sink 300 comprising a base plate 302 and a plurality of fins 304 extending from the base plate. The fin 304 may also be referred to as a flange. The base plate 302 and the fins 304 comprise a plurality of layers of graphene film 212 reaching from a bottom surface 306 to a top surface 308 of the heat sink 300, each layer of graphene film 212 being separated from an adjacent layer of graphene film by an adhesive layer 210, and each layer of graphene film 212 having an anisotropic thermal conductivity. The heat sink 300 thus comprises vertically aligned layers of the laminated graphene film 212.

It is also possible to cut the graphene block 214 from the other side, i.e. in a direction perpendicular to the plane of the laminated graphene films 212. Moreover, the graphene block 214 may also be cut at an angle as long as the advantages of the high in-plane thermal conductivity is maintained in at least one direction.

Figure 4:
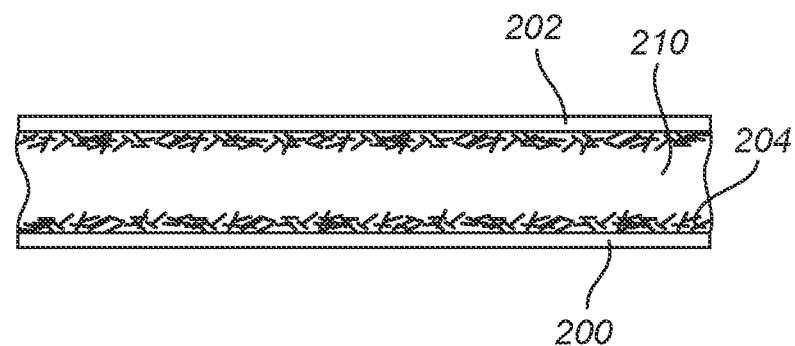
FIG. 4 schematically illustrates a heat sink according to an embodiment of the invention.

FIG. 4 is a close up illustration of two graphene films 200, 202 attached to each other where it is shown how the nanoparticles 204 are attached to the surfaces of the two graphene films 200, 202 and embedded in the adhesive 210. Accordingly, the nanoparticles 204 will be present in the adhesive 210, which may be significantly thicker than the length of the nanoparticles 204. Even though the invention has been described with reference to exemplifying embodiments thereof, many different alterations, modifications and the like will become apparent for those skilled in the art. Also, it should be noted that parts of the method may be omitted, interchanged or arranged in various ways, the method yet being able to perform the functionality of the present invention.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

What is claimed is:

1. A laminated graphene heat sink comprising:
a base plate and a plurality of fins extending from the base plate;
wherein the base plate and the fins comprise a plurality of layers of graphene film reaching from a bottom surface to a top surface of the heat sink, each layer of graphene film being separated from an adjacent layer of graphene film by an adhesive layer, and each layer of graphene film having an anisotropic thermal conductivity, and
wherein each adhesive layer further comprises a first layer of nanoparticles arranged at a surface of a first graphene film and a second layer of nanoparticles arranged at a surface of a second graphene film adjacent to the first graphene film, wherein the nanoparticles are embedded in the adhesive.

2. The heat sink according to claim 1, wherein the base plate and the fins of the heat sink are formed from a single solid graphene block comprising a plurality of layers of graphene film.

3. The heat sink according to claim 1, wherein the thermal conductivity of a fin is higher in the plane of the fin than in a direction perpendicular to the plane of the fin.

4. The heat sink according to claim 1, wherein the thermal conductivity of a fin is higher in a direction perpendicular to the plane of the fin and in a first direction of the plane of the fin compared to in a second direction of the plane of the fin.

5. The heat sink according to claim 1, wherein the graphite film comprises a plurality of graphene layers having a turbostratic alignment between adjacent graphene layers.

6. The heat sink according to claim 1, wherein a ratio of adhesive in the in the thermally conductive film is in the range of 10 wt % to 90 wt %.

7. The heat sink according to claim 1, wherein the adhesive consists of at least one of, polyurethane, silicone rubber, polyimide, epoxy resin and polyacrylic resin.

8. The heat sink according to claim 1, wherein the first and second layer of nanoparticles comprises needle shaped nanoparticles configured to anchor the first graphene film to the second graphene film.

9. The heat sink according to claim 8, wherein the needle shaped nanoparticles comprises one of $Al_2O_3$, $SiO_2$, $Fe_2O_3$, $NiO_2$, $Cr_2O_3$, ZnO, Ag, Al, Cu, Ni, Cr, Ti, Mo, Fe, Mg and Li.

10. The heat sink according to claim 8, wherein the needle shaped nanoparticles have a length in the range of 5 to 100 nm.

* * * * *